(12) United States Patent
Jarrar et al.

(10) Patent No.: US 11,048,292 B2
(45) Date of Patent: Jun. 29, 2021

(54) DUTY CYCLE CONTROL FOR REDUCED DYNAMIC POWER CONSUMPTION

(71) Applicant: NXP USA, INC., Austin, TX (US)

(72) Inventors: Anis Mahmoud Jarrar, Austin, TX (US); John Mark Boyer, Austin, TX (US); Nancy Hing-Che Amedeo, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/219,029

(22) Filed: Dec. 13, 2018

(65) Prior Publication Data

US 2020/0192419 A1    Jun. 18, 2020

(51) Int. Cl.
*G06F 1/08* (2006.01)
*G06F 1/3234* (2019.01)
*H03K 19/00* (2006.01)
*H03K 3/012* (2006.01)

(52) U.S. Cl.
CPC .............. *G06F 1/08* (2013.01); *G06F 1/3234* (2013.01); *H03K 19/0016* (2013.01); *H03K 3/012* (2013.01)

(58) Field of Classification Search
CPC ..... G06F 1/04; G06F 1/08; G06F 1/26; G06F 1/32; G06F 1/3203; G06F 1/3234; H03K 19/0008; H03K 19/0016; H03K 3/01; H03K 3/012
See application file for complete search history.

(56) References Cited

U.S. PATENT DOCUMENTS

| | | | |
|---|---|---|---|
| 4,104,860 A | 8/1978 | Stickel | |
| 4,885,758 A * | 12/1989 | Speckenbach | H04J 3/073 375/371 |
| 6,668,357 B2 | 12/2003 | Masleid | |
| 6,977,528 B2 | 12/2005 | Kang et al. | |
| 7,342,425 B1 * | 3/2008 | Kang | H03K 23/505 327/115 |
| 2012/0014169 A1* | 1/2012 | Snider | G11C 5/141 365/148 |
| 2016/0065220 A1 | 3/2016 | Rana et al. | |
| 2019/0332465 A1* | 10/2019 | Jones | G11C 7/10 |

FOREIGN PATENT DOCUMENTS

TW    201528689 A    7/2015

OTHER PUBLICATIONS

Castro, J., "Asymmetric clock driver for improved power and noise performances", IEEE International Symposium on Circuits and Systems, 2007.
Gnanamurthy, R., "Low-Power Delay Buffer Design Using Asymmetric C-Element Gated Clock Strategy", 5th ICCCNT 2014, Jul. 11-13, 2014.

(Continued)

*Primary Examiner* — Diana J. Cheng

(57) ABSTRACT

An integrated circuit includes a master-slave storage element having a data input coupled to receive a data signal and an asymmetrical clock generator coupled to provide an asymmetrical clock signal to the master-slave storage element. A first phase of the asymmetrical clock signal is configured for inhibiting intermediate data signal transitions from propagating through the master portion of the master-slave storage element.

20 Claims, 5 Drawing Sheets

(56) References Cited

OTHER PUBLICATIONS

Grover, N., "Reduction of Power Consumption in FPGAs—An Overview", I.J. Information Engineering and Electronic Business, 2012.
Lang, T., "Individual Flip-Flops with Gated Clocks for Low Power Datapaths", IEEE Transactions on Circuits and Systems—II: Analog and Digital Signal Processing, vol. 44, No. 6, Jun. 1997.
Lim, H., "Flip-Flop Insertion with Shifted-Phase Clocks for FPGA Power Reduction", IEEE 2005.
Trotta, S., "A Novel Design of an Asymmetric D-Latch", 2004 Topical Meeting on Silicon Monolithic Integrated Circuits in RF Systems, IEEE 2004.
Vijayakumar, A., :Glitch Power Reduction via Clock Skew Scheduling, IEEE Computer Society Annual Symposium on VLSI, 2014.

\* cited by examiner

DUTY CYCLE CONTROL FOR REDUCED DYNAMIC POWER CONSUMPTION

BACKGROUND

Field

This disclosure relates generally to integrated circuits, and more specifically, to duty cycle control for reduced dynamic power consumption in integrated circuits.

Related Art

Today many integrated circuits are battery powered and rely heavily on low power consumption to achieve extended battery life. These integrated circuits typically include millions of transistors with a significant portion of the transistors consuming dynamic power during normal operation. To minimize dynamic power consumption and extend battery life, there is a need for improved low power techniques.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an integrated circuit that includes asymmetrical clock generation circuitry coupled to provide to an asymmetrical clock to one or more storage elements configured in a master-slave arrangement. The asymmetrical clock is generated having a predetermined duty cycle greater than 50% such that intermediate data transitions are inhibited from propagating through master portions of the storage elements. By inhibiting the intermediate data transitions and glitches from propagating through the master portions, significant dynamic power savings can be realized.

Figure 1:
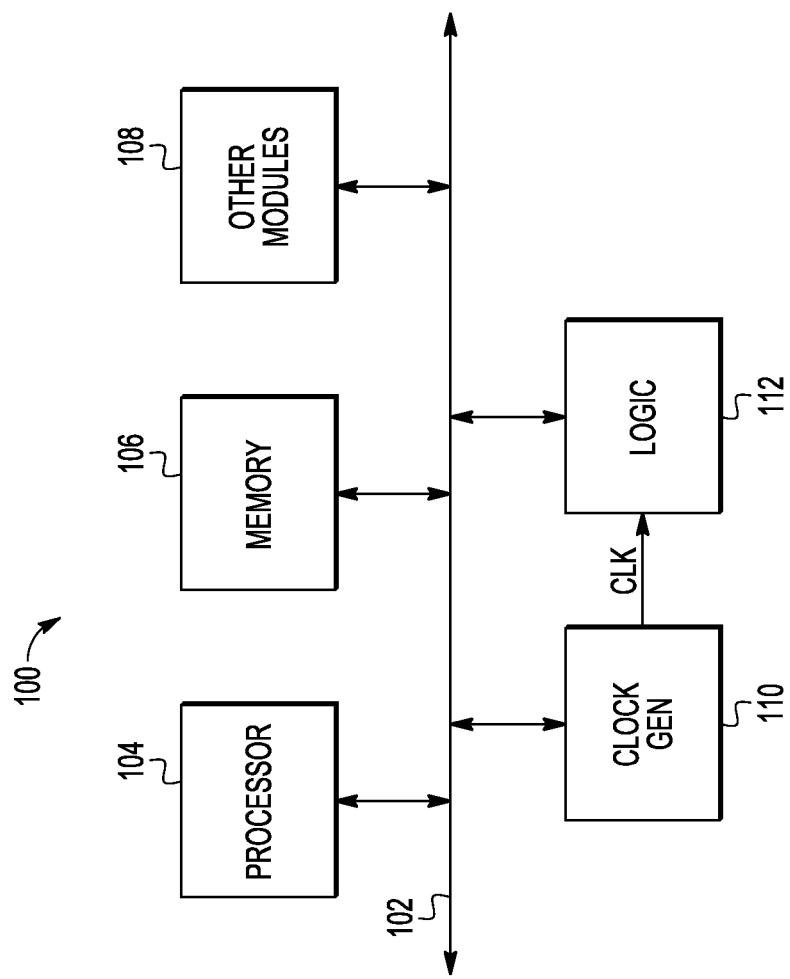
FIG. 1 illustrates, in simplified block diagram form, an example integrated circuit in accordance with an embodiment.

FIG. 1 illustrates, in simplified block diagram form, an example integrated circuit 100 in accordance with an embodiment. Integrated circuit 100 includes a system bus 102, processor 104, memory 106, other modules 108, clock generator 110, and logic 112. Processor 104, memory 106, other modules 108, clock generator 110, and logic 112 are each bi-directionally coupled to system bus 102 by way of respective communication buses. In some embodiments, integrated circuit 100 may be characterized as a system-on-a-chip (SoC), for example.

System bus 102 can be any type of bus for communicating any type of information and/or transferring any type of signals such as address, data, instructions, clocks, reset, and control. System bus 102 provides a communication backbone for communications among the processor 104, memory 106, other modules 108, clock generator 110, and logic 112.

Processor 104 may be any type of processor, including circuits for processing, computing, etc., such as microprocessor (MPU), microcontroller (MCU), or digital signal processor (DSP), or other type of processing circuitry. Integrated circuit 100 may include multiple processors like processor 104. Processor 104 is configured to execute instructions in order to carry out designated tasks.

Memory 106 may include any suitable type of memory array, such as static random-access memory (SRAM), for example. Memory 106 may also be coupled directly or tightly coupled to processor 104. Integrated circuit 100 may include multiple memories like memory 106 or a combination of different memories. For example, integrated circuit 100 may include a flash memory in addition to memory 106.

Other modules 108 of integrated circuit 100 may include any number of other circuits and functional hardware modules such as accelerators, timers, counters, communications, interfaces, analog-to-digital converters, digital-to-analog converters, PLLs, and the like for example.

Clock generator 110 may include one or more PLLs and other clock circuitry to provide clock signals for processor 104, memory 106, other modules 108, and logic 112. Clock generator 110 may include a phase-locked loop (PLL) clock and/or other circuitry configured to generate clock signals. In this embodiment, clock generator 110 is configured to generate source clock signal labeled CLK for logic 112.

Logic 112 may include one or more logic circuits such as combinational logic, storage elements, flip flops, state machines, and the like, for example. Logic 112 may also include associated control circuits (e.g., clock generators, reset circuits, mode circuits, etc.). Logic 112 may be configured to perform any number of logical functions or operations and may be as characterized as a logic circuit within a larger circuit, functional block, or module. In this embodiment, logic 112 is configured to receive the CLK source clock signal from clock generator 110.

Figure 2:
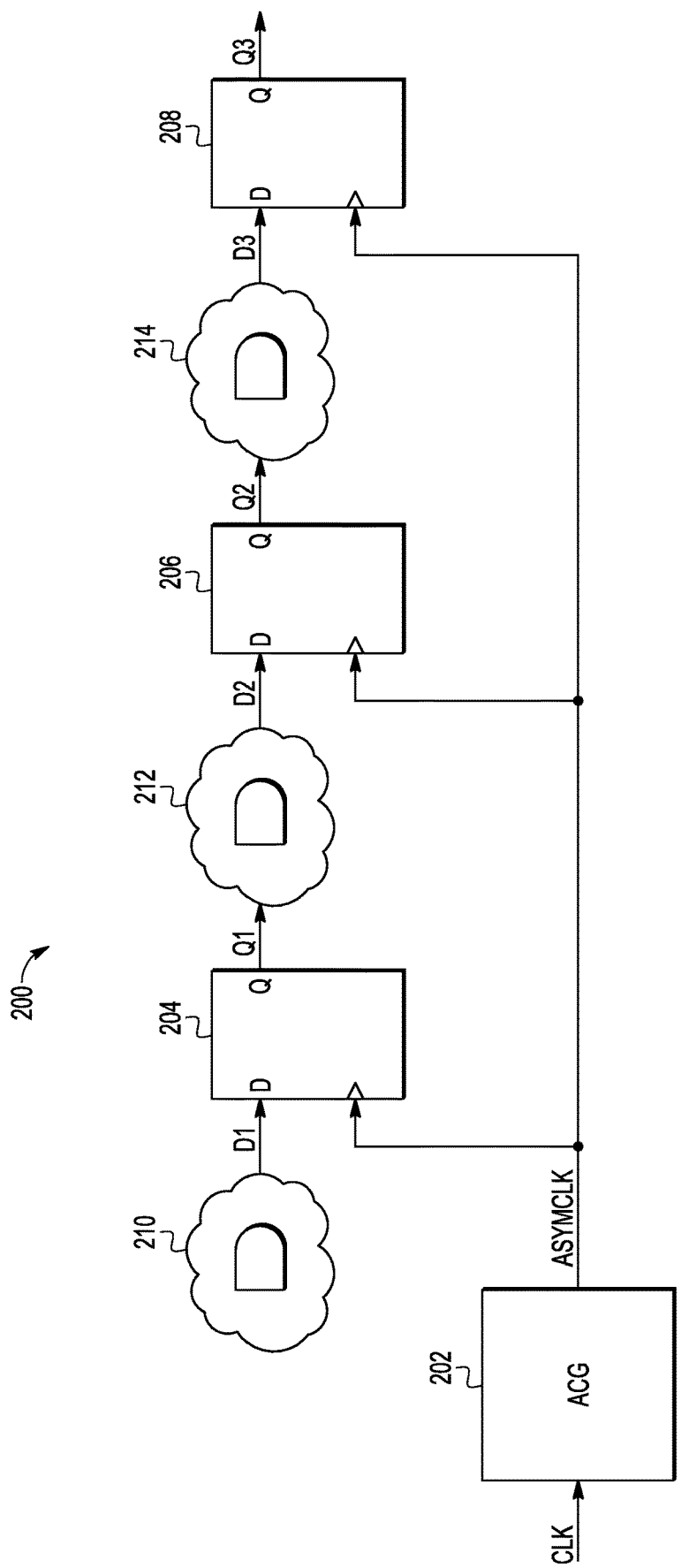
FIG. 2 illustrates, in simplified schematic diagram form, an example clock duty cycle control circuit in accordance with an embodiment.

FIG. 2 illustrates, in simplified schematic diagram form, an example clock duty cycle control circuit 200 in accordance with an embodiment. In the embodiment depicted in FIG. 2, circuit 200 includes asymmetrical clock generator (ACG) 202, storage elements 204-208, and logic circuits 210-214. In other embodiments, circuit 200 may include asymmetrical clock generator 202 along with other numbers of storage elements and logic circuits.

The asymmetrical clock generator 202 includes an input for receiving a source clock signal labeled CLK and an output for providing an asymmetrical clock signal labeled ASYMCLK. The CLK clock signal may come from a clock generator circuit like clock generator 110 depicted in FIG. 1. The output of the asymmetrical clock generator 202 is coupled to provide the ASYMCLK clock signal at clock inputs of storage elements 204-208 by way of signal lines labeled ASYMCLK. The asymmetrical clock generator 202 is configured to provide the ASYMCLK signal having a first phase (e.g., logic high phase) longer than a second phase (e.g., logic low phase). For example, the ASYMCLK signal may have a 60% duty cycle where the first phase is approximately 60% of the ASYMCLK signal period.

The storage elements 204-208 may be any suitable storage elements (e.g., flip flops) having a master-slave circuit structure where the master and slave portions may be clocked on alternate clock phases. Each storage element 204-208 includes a data input labeled D for receiving a data signal, a clock input indicated by a triangular symbol for receiving a clock signal (e.g., ASYMCLK), and an output labeled Q for providing a stored data value. The storage elements 204-208 may include other inputs (e.g., set, reset, scan enable) and outputs (e.g., complement output QB). In this embodiment, storage elements 204-208 may be characterized as D-type or D flip flops, state-retention flip flops, scan flip flops, multi-bit flip flops, and so on.

The logic circuits 210-214 may include any combinational or random logic circuits, gates (e.g., AND, OR, NAND, NOR, XOR, NOT), or other logic circuits configured to perform logical functions or operations. In this embodiment, the logic circuits 210-214 are coupled to storage elements 204-208. For example, an output of logic circuit 210 is coupled to provide a data signal D1 at the D input of storage element 204, and the Q output of storage element 204 is coupled to provide an output signal Q1 to logic circuit 212. An output of logic circuit 212 is coupled to provide a data signal D2 at the D input of storage element 206, and the Q output of storage element 206 is coupled to provide an output signal Q2 to logic circuit 214. An output of logic circuit 214 is coupled to provide a data signal D3 at the D input of storage element 208, and so on.

Figure 3:
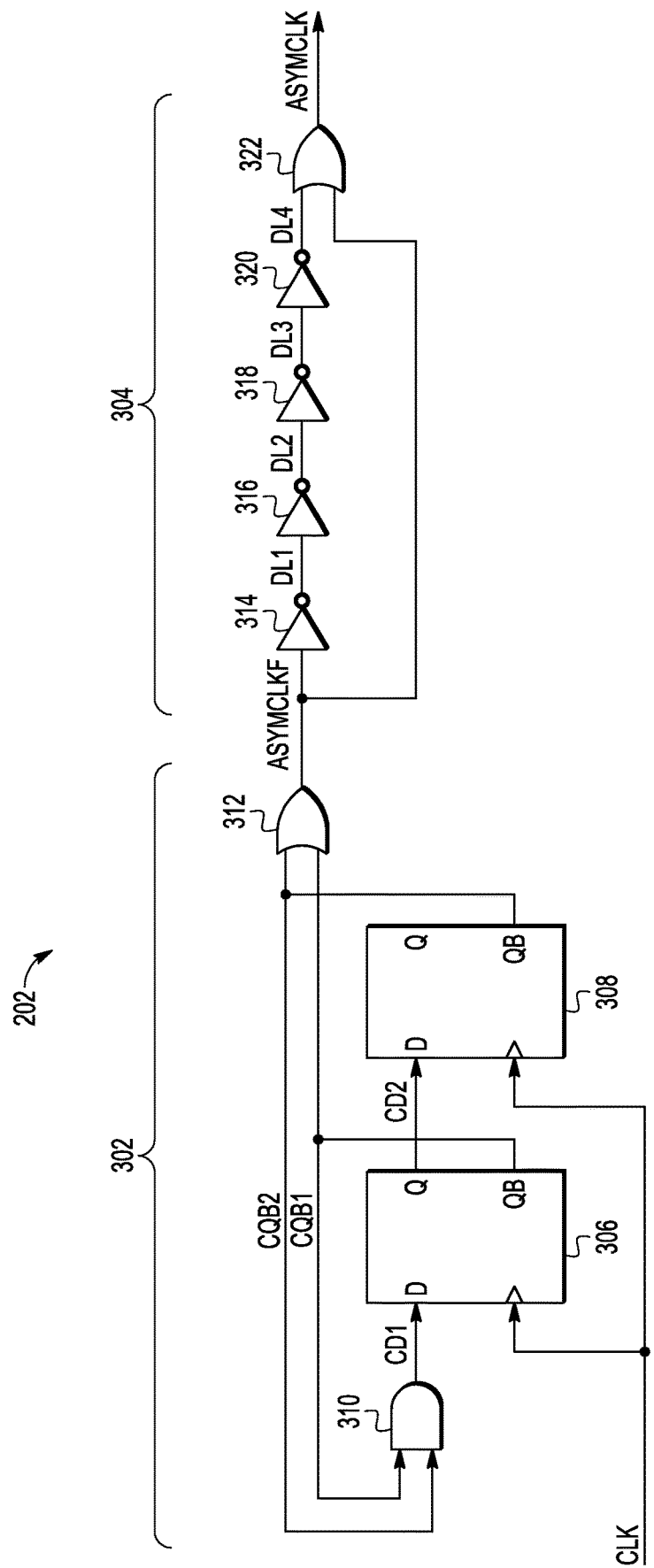
FIG. 3 illustrates, in simplified schematic diagram form, an example asymmetrical clock generator circuit in accordance with an embodiment.

FIG. 3 illustrates, in simplified schematic diagram form, an example implementation of the asymmetrical clock generator 202 in accordance with an embodiment. The asymmetrical clock generator 202 includes an input coupled to receive a clock signal labeled CLK and an output for proving an asymmetrical clock signal labeled ASYMCLK. In this embodiment, the asymmetrical clock generator 202 includes a counter-based divider circuit portion 302 and a phase delay circuit portion 304. The divider circuit 302 may serve as a coarse adjustment circuit and the delay circuit 304 may serve as a fine adjustment when generating the asymmetrical clock signal. In this embodiment, the asymmetrical clock generator 202 is configured to generate an asymmetrical clock signal having a duty cycle greater than 50%. In some embodiments, the asymmetrical clock generator 202 is configured to generate the asymmetrical clock signal having a duty cycle in a range of 60% to 80%.

The divider circuit 302 may be any suitable frequency divider circuit configured to generate an output signal having an asymmetrical duty cycle. In this embodiment, divider circuit 302 includes a divide-by 3 counter and is configured to generate a divide-by 3 asymmetrical clock signal having approximately a 66% duty cycle (e.g., two-thirds of the cycle active or at a logic high level). The divider circuit 302 includes flip flops 306-308, AND gate 310, and OR gate 312. Each flip-flop 306-308 includes a data input labeled D, a clock input indicated by a triangular symbol, an output labeled Q, and a complement output labeled QB. The clock inputs of flip flop 306-308 are coupled to receive the CLK signal by way of signal line labeled CLK. The Q output of flip flop 306 is coupled to the D input of flip flop 308 by way of signal line labeled CD2. The QB output of flip flop 306 is coupled to a first input of AND gate 310 and a first input of OR gate 312 by way of signal line labeled CQB1. The QB output of flip flop 308 is coupled to a second input of AND gate 310 and a second input of OR gate 312 by way of signal line labeled CQB2. An output of AND gate 310 is coupled to the D input of flip flop 306 by way of signal line labeled CD1. An output of OR gate 312 is coupled to provide an asymmetrical, counter-based divided signal labeled ASYMCLKF to the delay circuit 304.

The delay circuit 304 may be any suitable delay circuit configured to generate a phase delay by adding time delay to an active phase of a signal for fine adjustments (e.g., 0% to 10% increase) to the duty cycle of the signal. For example, the delay circuit 304 may be configured to modify the duty cycle of the ASMYCLKF signal to have approximately a 70% duty cycle by delaying the active phase of the ASMYCLKF signal by an additional 4% of the cycle. The delay circuit 304 includes an input coupled to receive the ASMYCLKF signal and an output for providing the asymmetrical clock signal ASYMCLK. In this embodiment, the delay circuit 304 includes a first signal path formed by series connected delay inverters 314-320 coupled to a first input of OR gate 322 and a second signal path coupled to a second input of OR gate 322. Each inverter 314-320 may be configured to have a predetermined delay amount such that the overall delay of the first signal path meets a desired target. An input of inverter 314 is coupled to receive the ASMYCLKF signal and an output of inverter 314 is coupled to an input of inverter 316 by way of signal line DL1. An output of inverter 316 is coupled to an input of inverter 318 by way of signal line DL2 and an output of inverter 318 is coupled to an input of inverter 320 by way of signal line DL3. An output of inverter 320 is coupled to the first input of OR gate 322 by way of signal line DL4, the second input of OR gate 322 is coupled to receive the ASYMCLKF signal, and an output of OR gate 322 is coupled to provide the ASYMCLK signal. In this configuration, delay circuit 304 add delay to the active phase (e.g., logic high phase) of the ASYMCLKF to form the ASYMCLK signal with a desired duty cycle. In other embodiments, the delay circuit 304 may include other elements (e.g., resistors, capacitors) either alone or in combination with one or more delay inverters to form the desired delay of the first signal path. By construction, both the divider circuit 302 and delay circuit 304 are configured with circuitry which allows the asymmetrical clock generator 202 to track process, voltage, and temperature.

Figure 4:
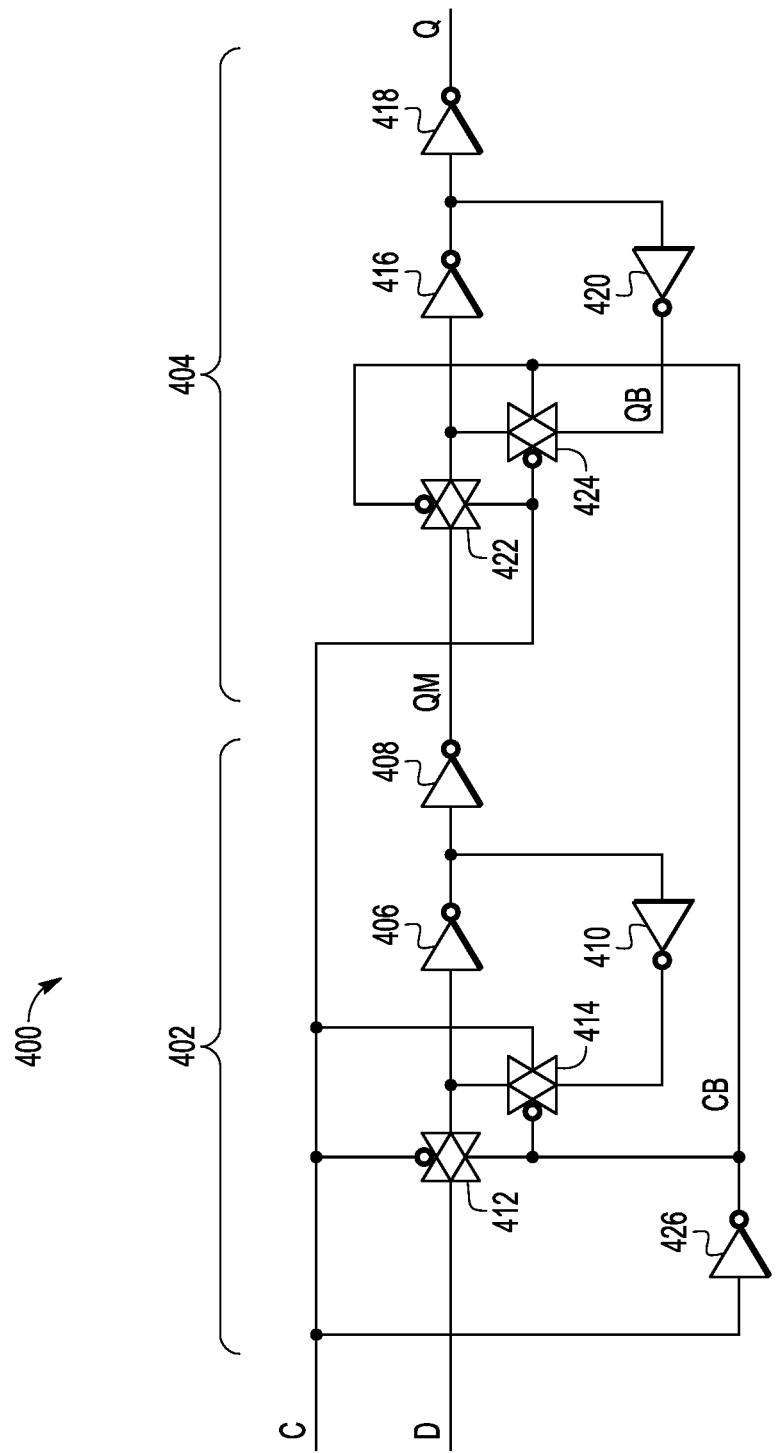
FIG. 4 illustrates, in simplified schematic diagram form, an example master-slave storage element circuit in accordance with an embodiment.

FIG. 4 illustrates, in simplified schematic diagram form, an example implementation of a master-slave flip flop circuit 400 in accordance with an embodiment. In an embodiment, flip flop 400 is representative of storage elements 204-208. The flip flop 400 may also be referred to as a D-type flip flop, data flip flop, and D flip flop. Flip flop 400 includes a first input node labeled C for receiving a clock signal C, a second input node labeled D for receiving a data signal D, and an output node labeled Q for providing a data output signal Q. A complement clock signal is provided at node labeled CB by way of inverter 426. In this example, flip flop 400 includes a master circuit portion 402 and a slave circuit portion 404 coupled in series. Alternative circuits may be used to implement storage elements 204-208 in accordance with an embodiment of the present disclosure.

The master circuit 402 includes inverters 406-410 and transmission gates 412-414. A first terminal of transmission gate 412 is coupled at an input labeled D to receive a data signal and a second terminal of transmission gate 412 is coupled to an input of inverter 406 and a first terminal of transmission gate 414. An active low control input of transmission gate 412 is coupled at the C node and an active high control input of transmission gate 412 is coupled at the CB node. An output of inverter 406 is coupled to inputs of inverters 408 and 410 and an output of inverter 410 is coupled to a second terminal of transmission gate 414. An active high control input of transmission gate 414 is coupled at the C node and an active low control input of transmission gate 414 is coupled at the CB node. An output of inverter 408 is coupled to an input of the slave circuit 404 at node labeled QM.

The slave circuit 404 includes inverters 416-420 and transmission gates 422-424. A first terminal of transmission gate 422 is coupled at node QM to receive an output data signal QM from the master circuit 402. A second terminal of transmission gate 422 is coupled to an input of inverter 416 and a first terminal of transmission gate 424. An active high control input of transmission gate 422 is coupled at the C node and an active low control input of transmission gate 422 is coupled at the CB node. An output of inverter 416 is coupled to inputs of inverters 418 and 420 and an output of inverter 420 is coupled to a second terminal of transmission gate 424. An active low control input of transmission gate 424 is coupled at the C node and an active high control input of transmission gate 424 is coupled at the CB node. An output of inverter 418 is coupled at the Q output node and provides the output data signal Q of flip flop 400.

In this example, the master circuit 402 is configured to be transparent when the clock signal C is at a logic low level allowing transitions of the data signal D to propagate through to the output QM. While transparent, the transitions can cause a significant amount of unwanted power consumption. The master circuit 402 is configured to be non-transparent when the clock signal C is at a logic high level (e.g., active phase) and transitions of the data are essentially stopped or blocked at transmission gate 412. By extending the logic high level (e.g., active phase) duration of the clock signal C to form an asymmetrical clock with a predetermined duty cycle greater than 50%, virtually all of the transitions can be inhibited or blocked from propagating through the master circuit 402, thus saving significant power.

In some embodiments, flip flop 400 may be configured as a state retention flip flop having the master circuit supplied by a voltage supply different from that of the slave circuit. For example, the master circuit may be supplied by a first voltage supply that is capable of being disabled during a state retention mode while the slave circuit remains powered by a second voltage supply having a voltage sufficient to retain a stored state in the slave circuit during the state retention mode. In normal operating modes, both first and second voltage supplies my supply a common voltage to respective master and slave circuits.

Figure 5:
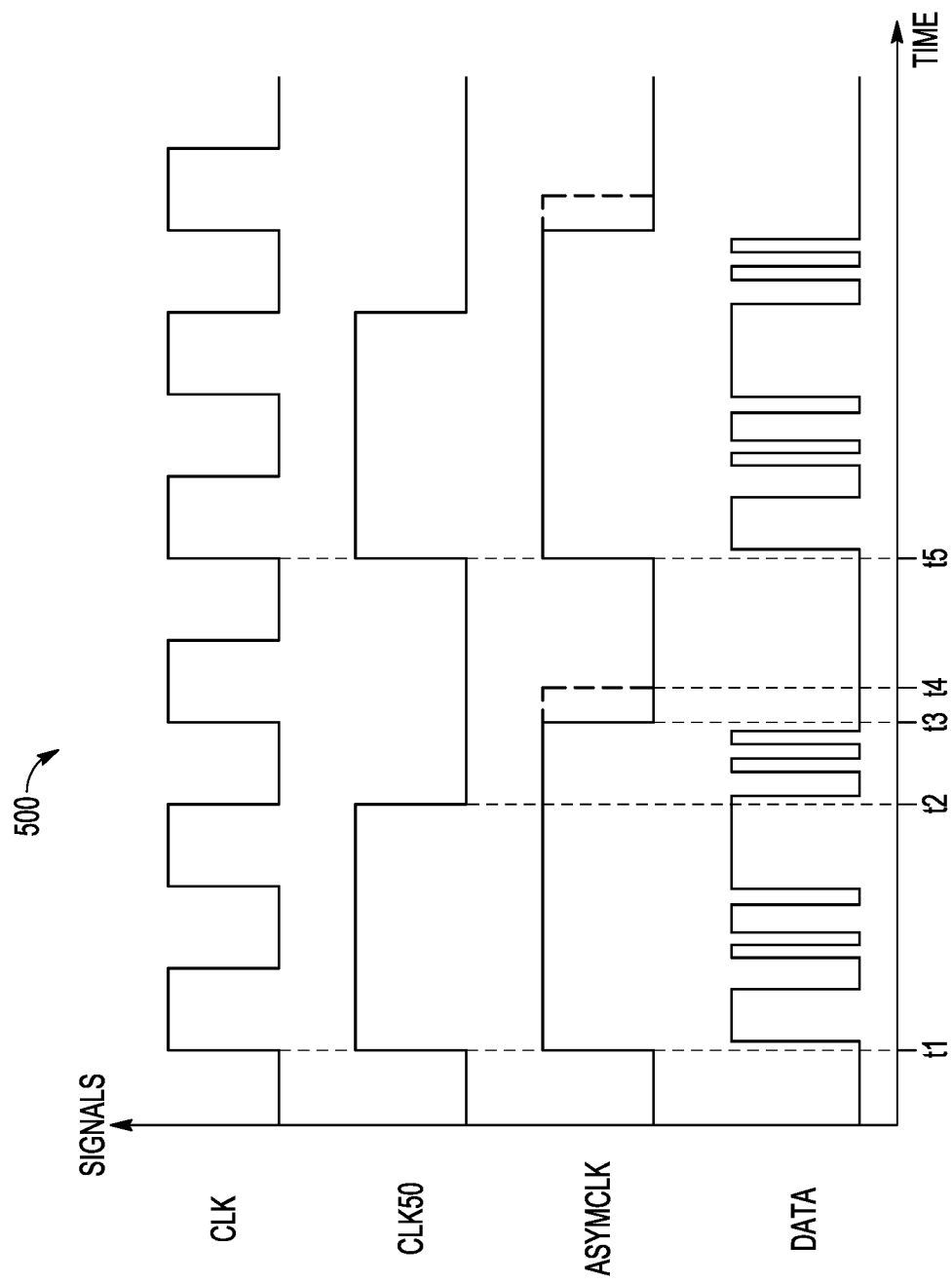
FIG. 5 illustrates, in simplified timing diagram form, example signal timing of clock duty cycle control circuit of FIG. 2 in accordance with an embodiment.

FIG. 5 illustrates, in simplified timing diagram form, example signal timing 500 of clock duty cycle control circuit of FIG. 2 in accordance with an embodiment. Signal timing 500 includes source clock signal CLK, example 50% duty cycle clock signal CLK50, asymmetrical clock signal ASYMCLK, and example data signal DATA waveforms. As provided above, the example implementation of the asymmetrical clock generator 202 as depicted in FIG. 3 includes counter-based divider circuitry 302 and a phase delay circuitry 304 for generating a divide-by 3 asymmetrical clock signal ASYMCLK. The ASYMCLK waveform is shown having a counter-based divided-by 3 active portion from time marker t1 to t3 and a phase delayed portion from time marker t3 to t4. In some embodiments, the phase delayed portion may range from 0% to 10% for fine adjustments to the duty cycle of ASYMCLK. For comparison purposes, the CLK50 signal is shown as a 50% duty cycle version of a divide-by 3 clock having an active phase (e.g., logic high level from time marker t1 to t2) approximately equal to 50% of the cycle time (e.g., from time marker t1 to t5).

The data signal DATA is shown transitioning from a logic low value to a logic high value and back to the logic low value several times from time marker t1 to t3. In this example the DATA signal may represent example data signals D1-D3 generated in respective logic circuits 210-214. Depending on the signal paths and the number of logic gates within those paths, the data signals D1-D3 may include several transitions like those shown in the DATA signal. Storage elements such as flip flops are typically clocked by a 50% duty cycle clock like CLK50. However, intermediate data transitions may occur while the master portion of the flip flops are transparent allowing the intermediate data transitions like those from timing marker t2 to t3 of the DATA waveform to propagate through the master portion. Accordingly, unwanted power consumption can occur. In contrast, when storage elements 204-208 are clocked by the ASYMCLK signal, the intermediate data transitions occur while the master circuit portion is non-transparent, thus resulting in significant power savings.

By now it should be appreciated that there has been provided an integrated circuit that includes asymmetrical clock generation circuitry coupled to provide to an asymmetrical clock to one or more storage elements configured in a master-slave arrangement. The asymmetrical clock is generated having a predetermined duty cycle greater than 50% such that intermediate data transitions are inhibited from propagating through master portions of the storage elements. By inhibiting the intermediate data transitions from propagating through the master portions, significant power savings can be realized.

Generally, there is provided, an integrated circuit including a first master-slave storage element having a data input coupled to receive a data signal; and an asymmetrical clock generator coupled to provide an asymmetrical clock signal to the first master-slave storage element, a first phase of the asymmetrical clock signal configured for inhibiting intermediate data signal transitions from propagating through the master portion of the first master-slave storage element. The asymmetrical clock generator may be configured to generate the first phase having a range of 60% to 80% of the asymmetrical clock cycle. The asymmetrical clock generator may include circuitry to generate the first phase of the asymmetrical clock such that the first phase tracks process, voltage, and temperature. The asymmetrical clock generator may include a counter-based divider circuit. The asymmetrical clock generator may include a phase delay circuit. The first master-slave storage element may be characterized as a D-type flip flop or D flip flop. The first master-slave storage element may be characterized as a state retention flip flop having the slave portion supplied by a voltage supply different from the master portion. The integrated circuit may further include a second master-slave storage element having a clock input coupled to receive the asymmetrical clock signal. The integrated circuit may further include a logic circuit coupled between an output of the first master-slave storage element and a data input of the second master-slave storage element, the first phase of the asymmetrical clock signal further configured for inhibiting intermediate data signal transitions from propagating through the master portion of the second master-slave storage element.

In one embodiment, there is provided, an integrated circuit including a first storage element having a master circuit and a slave circuit, the master circuit configured to be transparent during a first phase of a clock signal; and an asymmetrical clock generator coupled to provide the clock signal to the first storage element, the first phase of the clock signal configured to be longer than a second phase of the clock signal. The asymmetrical clock generator may be configured to provide the clock signal based on a counter-based divider circuit output signal. The asymmetrical clock generator may be configured to provide the clock signal based on a phase delay circuit output signal. The asymmetrical clock generator may be configured to generate the clock signal having a duty cycle in a range of 60% to 80%. The asymmetrical clock generator may include circuitry to generate the first phase of the clock such that the first phase tracks process, voltage, and temperature. The first storage element may be characterized as a D-type flip flop or D flip flop. The integrated circuit may further include a logic circuit coupled between an output of the first storage element and a data input of a second storage element, the second storage element having a clock input coupled to receive the clock signal.

In another embodiment, there is provided, an integrated circuit including a first storage element having a master circuit and a slave circuit, the master circuit coupled to receive a data signal and configured to be transparent during a first phase of a clock signal; and an asymmetrical clock generator coupled to provide the clock signal to the first storage element, the first phase of the clock signal configured for inhibiting intermediate data signal transitions from propagating through the master circuit. The asymmetrical clock generator may be configured to generate the clock signal having a duty cycle in a range of 60% to 80%. The asymmetrical clock generator may be configured to provide the clock signal based on a counter-based divider circuit output signal. The integrated circuit may further include a logic circuit coupled between an output of the first storage element and a data input of a second storage element, the second storage element having a clock input coupled to receive the clock signal.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a first master-slave storage element having a data input coupled to receive a data signal; and
   an asymmetrical clock generator coupled to provide an asymmetrical clock signal to the first master-slave storage element, a first phase of the asymmetrical clock signal used to inhibit intermediate data signal transitions received at an input of the storage element from propagating through the master portion of the first master-slave storage element, wherein the first phase of the asymmetrical clock signal is a logic high phase that is greater in duration than a second phase that is a logic low phase of the asymmetrical clock signal to inhibit the intermediate data signal transitions.

2. The integrated circuit of claim 1, wherein the asymmetrical clock generator is configured to generate the first phase having a range of 60% to 80% of the asymmetrical clock cycle.

3. The integrated circuit of claim 1, wherein the asymmetrical clock generator comprises circuitry to generate the first phase of the asymmetrical clock such that the first phase tracks process, voltage, and temperature.

4. The integrated circuit of claim 1, wherein the asymmetrical clock generator comprises a counter-based divider circuit.

5. The integrated circuit of claim 1, wherein the asymmetrical clock generator comprises a phase delay circuit.

6. The integrated circuit of claim 1, wherein the first master-slave storage element is characterized as a D-type flip flop or a D flip flop.

7. The integrated circuit of claim 1, wherein the first master-slave storage element is characterized as a state retention flip flop having the slave portion supplied by a voltage supply different from the master portion.

8. The integrated circuit of claim 1, further comprising a second master-slave storage element having a clock input coupled to receive the asymmetrical clock signal.

9. The integrated circuit of claim 8, further comprising a logic circuit coupled between an output of the first master-slave storage element and a data input of the second master-slave storage element, the first phase of the asymmetrical clock signal further configured for inhibiting intermediate data signal transitions from propagating through the master portion of the second master-slave storage element.

10. An integrated circuit comprising:
a first storage element having a master circuit and a slave circuit, the master circuit configured to be transparent during a first phase of a clock signal; and
an asymmetrical clock generator coupled to provide the clock signal to the first storage element to be used to inhibit intermediate transitions received at an input of the first storage element, the first phase of the clock signal is a logic high phase configured to be longer in duration than a second phase that is a logic low phase of the clock signal to inhibit the intermediate data signal transitions.

11. The integrated circuit of claim 10, wherein the asymmetrical clock generator is configured to provide the clock signal based on a counter-based divider circuit output signal.

12. The integrated circuit of claim 10, wherein the asymmetrical clock generator is configured to provide the clock signal based on a phase delay circuit output signal.

13. The integrated circuit of claim 10, wherein the asymmetrical clock generator is configured to generate the clock signal having a duty cycle in a range of 60% to 80%.

14. The integrated circuit of claim 10, wherein the asymmetrical clock generator comprises circuitry to generate the first phase of the clock such that the first phase tracks process, voltage, and temperature.

15. The integrated circuit of claim 10, wherein the first storage element is characterized as a D-type flip flop or a D flip flop.

16. The integrated circuit of claim 10, further comprising a logic circuit coupled between an output of the first storage element and a data input of a second storage element, the second storage element having a clock input coupled to receive the clock signal.

17. An integrated circuit comprising:
a first storage element having a master circuit and a slave circuit, the master circuit coupled to receive a data signal and configured to be transparent during a first phase of a clock signal; and
an asymmetrical clock generator coupled to provide the clock signal to the first storage element, the first phase of the clock signal to be used to inhibit intermediate data signal transitions received at an input of the first storage element from propagating through the master circuit, wherein the first phase of the asymmetrical clock signal is a logic high phase that is greater in duration than a second phase that is a logic low phase of the asymmetrical clock signal to inhibit the intermediate data signal transitions.

18. The integrated circuit of claim 17, wherein the asymmetrical clock generator is configured to generate the clock signal having a duty cycle in a range of 60% to 80%.

19. The integrated circuit of claim 17, wherein the asymmetrical clock generator is configured to provide the clock signal based on a counter-based divider circuit output signal.

20. The integrated circuit of claim 17, further comprising a logic circuit coupled between an output of the first storage element and a data input of a second storage element, the second storage element having a clock input coupled to receive the clock signal.

* * * * *